(12) United States Patent
Cho

(10) Patent No.: US 11,894,402 B2
(45) Date of Patent: Feb. 6, 2024

(54) IMAGING DEVICE AND ELECTRIC DEVICE

(71) Applicant: GUANGDONG OPPO MOBILE TELECOMMUNICATIONS CORP., LTD., Guangdong (CN)

(72) Inventor: Hirotake Cho, Kanagawa-Ken (JP)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 456 days.

(21) Appl. No.: 17/210,089

(22) Filed: Mar. 23, 2021

(65) Prior Publication Data

US 2021/0210533 A1    Jul. 8, 2021

Related U.S. Application Data

(63) Continuation of application No. PCT/CN2018/107719, filed on Sep. 26, 2018.

(51) Int. Cl.
   *H01L 27/146* (2006.01)
   *G06F 1/16* (2006.01)

(52) U.S. Cl.
   CPC .. *H01L 27/14609* (2013.01); *H01L 27/14625* (2013.01); *G06F 1/1686* (2013.01)

(58) Field of Classification Search
   None
   See application file for complete search history.

(56) References Cited

U.S. PATENT DOCUMENTS

| 8,022,977 B2 * | 9/2011 | Kanade | H04N 7/144 345/207 |
| 2008/0106628 A1 * | 5/2008 | Cok | H04N 7/144 348/E5.022 |
| 2009/0009628 A1 | 1/2009 | Janicek | |
| 2009/0102763 A1 * | 4/2009 | Border | H04N 7/144 345/87 |
| 2010/0309285 A1 | 12/2010 | Bolle | |
| 2012/0105400 A1 | 5/2012 | Mathew et al. | |

(Continued)

FOREIGN PATENT DOCUMENTS

| CN | 104181725 A | 12/2014 |
| CN | 105094307 A | 11/2015 |
| CN | 106850897 A | 6/2017 |

(Continued)

OTHER PUBLICATIONS

Communication pursuant to Article 94(3) EPC for EP Application 18934631.5 dated Mar. 25, 2022. (7 pages).

(Continued)

*Primary Examiner* — James M Hannett
(74) *Attorney, Agent, or Firm* — Young Basile Hanlon & MacFarlane, P.C.

(57) ABSTRACT

An imaging device according to the embodiments of the present disclosure has a display including a wiring layer; a camera located at a back side of the display, the camera including an optical lens and an imaging sensor to sense the light through the display to create an image; an optical element between the display and the camera, wherein the optical element filters the light through the display and passes the filtered light to the camera, and the optical element reduces a diffraction due to the wiring layer.

13 Claims, 23 Drawing Sheets

(56) References Cited

U.S. PATENT DOCUMENTS

2014/0111749 A1    4/2014  Won et al.

FOREIGN PATENT DOCUMENTS

| CN | 107065370 A | 8/2017 |
| CN | 108376696 A | 8/2018 |
| CN | 108551544 A | 9/2018 |
| JP | H08254604 A | 10/1996 |
| JP | 2006039097 A | 2/2006 |
| JP | 2011107379 A | 6/2011 |

OTHER PUBLICATIONS

International Search Report for PCT/CN2018/107719 dated Dec. 18, 2018.
Extended European Search Report for EP Application 18934631.5 dated Aug. 16, 2021. (10 pages).
Communication pursuant to Article 94(3) EPC for EP Application 18934631.5 dated Aug. 11, 2022. (6 pages).
Chinese Office Action with English Translation for CN Application 201880097133.1 dated Aug. 25, 2022. (30 pages).

\* cited by examiner

IMAGING DEVICE AND ELECTRIC DEVICE

CROSS-REFERENCE TO RELATED APPLICATION(S)

This application is a continuation application of International Application No. PCT/CN2018/107719, filed on Sep. 26, 2018, the entire contents of which are incorporated herein by reference.

TECHNICAL FIELD

The present disclosure related to an imaging device and an electric device.

BACKGROUND

Nowadays, a display of an electric device can be transparent and therefore a camera to take pictures can also be placed behind the display to make a wider area for the display on a front surface of the electric device. However, a light from the display to camera is influenced by optical characteristics of the display. Therefore, if pictures are taken by the camera behind the display, a quality of image of the pictures will be degraded due to the optical disturbance caused by the display.

The disturbance is mainly reflection at the display or diffraction due to wires of a wiring layer of the display. Particularly, the diffraction causes severe ugly artifact on the image captured by the camera and now there is no effective solutions to resolve this problem.

SUMMARY

An imaging device may include:
a display including a wiring layer;
a camera located at a back side of the display, the camera including an optical lens and an imaging sensor to sense the light through the display to create an image;
an optical element between the display and the camera, wherein the optical element filters the light through the display and passes the filtered light to the camera, and the optical element reduces a diffraction due to the wiring layer.

An electric device may include:
the imaging device according to the disclosure mentioned above; and
an image correction circuitry configured to correct the image created by the camera.

BRIEF DESCRIPTION OF DRAWINGS

These and/or other aspects and advantages of embodiments of the present disclosure will become apparent and more readily appreciated from the following descriptions made with reference to the drawings, in which.

DETAILED DESCRIPTION

Figure 1:
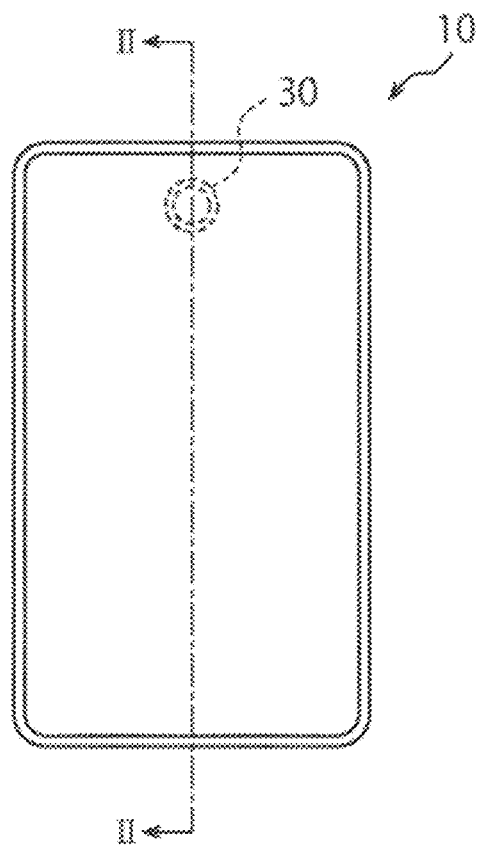
FIG. 1 is a schematic plan view of an electric device according to embodiments of the present disclosure.

Embodiments of the present disclosure will be described in detail and examples of the embodiments will be illustrated in the accompanying drawings. The same or similar elements and the elements having same or similar functions are denoted by like reference numerals throughout the descriptions. The embodiments described herein with reference to the drawings are explanatory, which aim to illustrate the present disclosure, but shall not be construed to limit the present disclosure.

Figure 2:
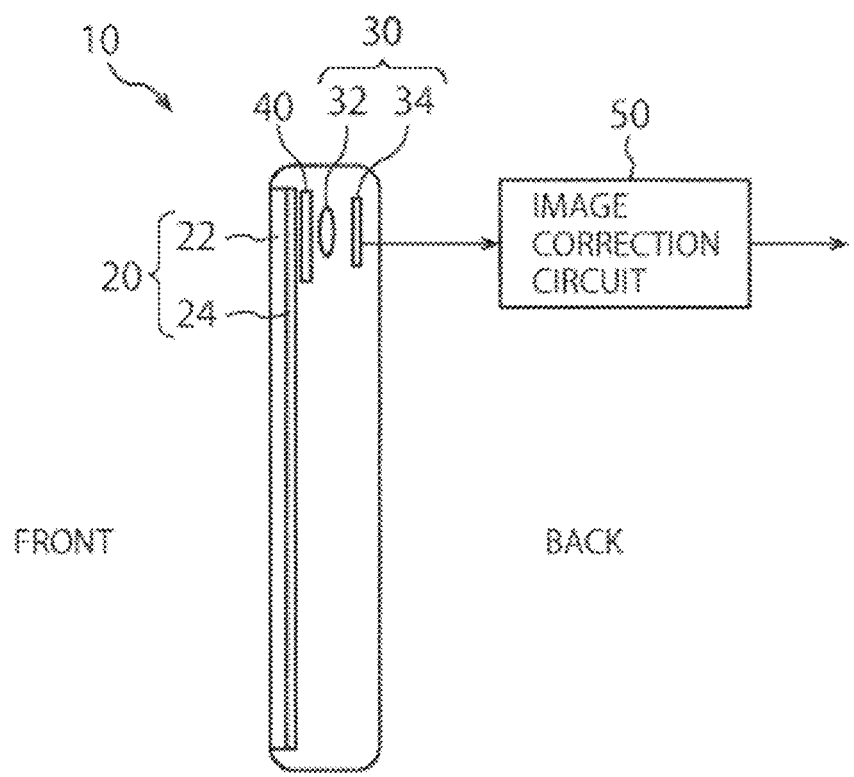
FIG. 2 is a cross sectional view taken along line II-II of the electric device of FIG. 1.

FIG. 1 illustrates an electric device 10 according to embodiments of the present disclosure and FIG. 2 illustrates a cross sectional view taken along line II-II of the electric device of FIG. 1. In other words, FIG. 1 illustrates a layout of a front view of the electric device 10.

As shown in FIGS. 1 and 2, the electric device 10 may include a display 20, a camera 30 and an optical element 40 between the display 20 and the camera 30.

In the embodiments of the present disclosure, the electric device 10 is a mobile device, particularly a smartphone device. However, the electric device 10 may be various kinds of devices such a multifunctional mobile device, a laptop computer, a desktop computer, a tablet computer and so on.

The display 20 may be made of organic light emitting diodes (OLED) in the embodiments. The display 20 is substantially transparent and covers substantially all area of a front surface of the electric device 10. The display 20 may include a light emitting layer 22 and a wiring layer 24. The light emitting layer 22 emits lights in red, green and blue to create various kinds of image and characters on the front surface of the display 20. The front surface of the display 20 may be coated by an antireflection material. That is, an antireflection layer may be formed on the front surface of the display 20.

The wiring layer 24 is a substrate to form the display 20 and includes a plurality of wires in a predetermined wiring pattern. That is, wires are arranged in the wiring layer 24 to provide electric power to the organic light emitting diodes of the light emitting layer 22. In the embodiments, the wires are arranged in a latticed pattern.

The display 20 is not limited to a display formed of the organic light emitting diodes but may be formed of other kinds of transparent display such as a liquid crystal display (LCD) or the like.

The camera 30 is located behind the display 20. Therefore, the camera 30 is an embedded camera invisible for users of the electric device 10. The camera 30 may be placed anywhere under the display 20. In the embodiments, the camera is located at a back side of the display 20 and located on the center of an upper area of the electric device 10 of FIG. 1.

The camera 30 includes an optical lens 32 and an imaging sensor 34. The optical lens 32 gathers the light which has passed through the display 20 and focuses the light on the imaging sensor 34. The imaging sensor 34 senses the light to create an image.

Moreover, the electric device 10 according to the embodiments may further include an optical element 40 between the display 20 and the camera 30. In other words, the optical element 40 is interposed between the display 20 and the camera 30. The optical element 40 filters the light through the display 20 and passes the filtered light to the camera 30. Furthermore, the optical element 40 reduces optical disturbance based on the display 20. More specifically, in the embodiments, the optical element 40 has an optical mask with a special masking pattern or optical characteristics to attenuate diffraction due to the wiring layer 24 of the display 20. The display 20, the camera 30 and the optical element 40 constitute an imaging device in the embodiments. Of course, the imaging device may include other elements than the display 20, the camera 30 and the optical element 40.

In addition, the electric device 10 according to the embodiments may further include an image processing circuit 50 which processes the image acquired by the imaging sensor 34 of the camera 30. That is, the image acquired by the camera 30 is subjected to an image correction process of the image processing circuit 50.

The sharpness of the image would be degraded due to the optical element 40, the optical lens 32 and/or the display 20. In the embodiments, the image correction process of the image processing circuit 50 restores degradation of the image to improve sharpness.

Figure 3:
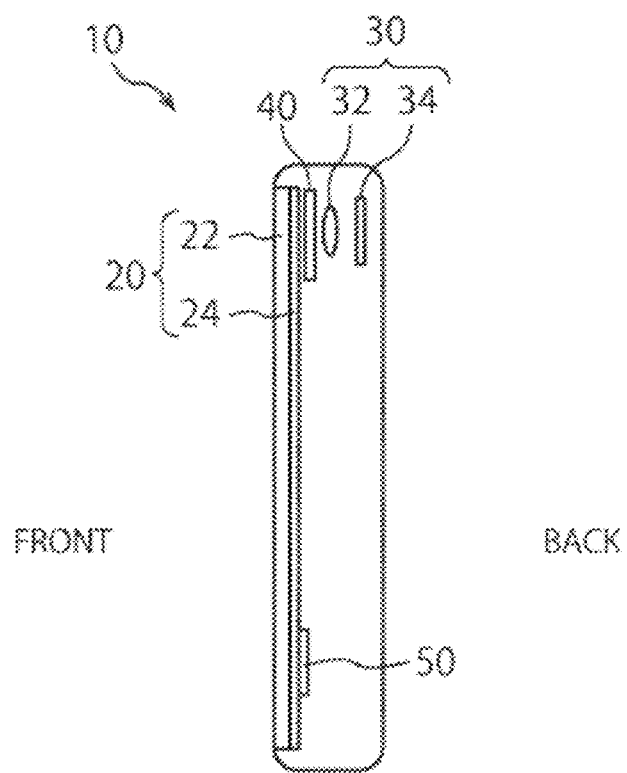
FIG. 3 is a cross sectional view taken along line II-II of the electric device of FIG. 1 and shows an example where an image correction circuit is incorporated in a wiring layer of a display.
Figure 4:
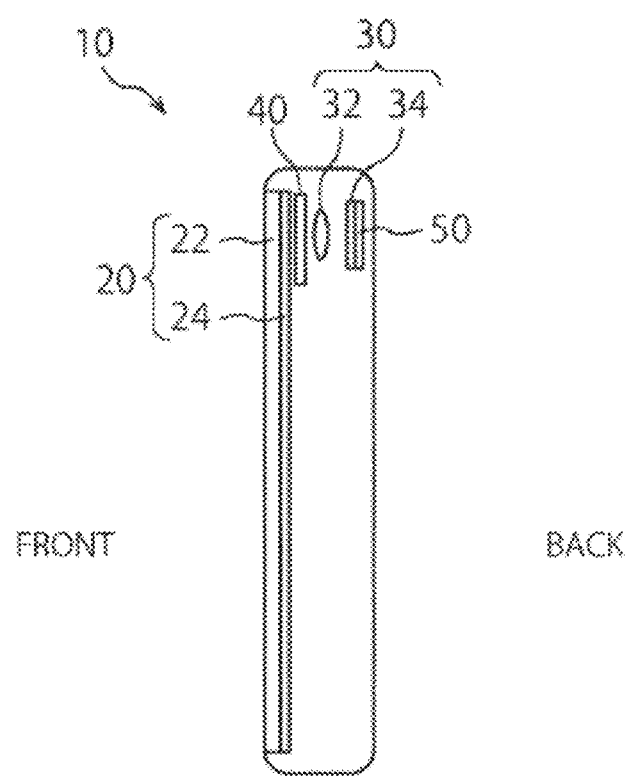
FIG. 4 is a cross sectional view taken along line II-II of the electric device of FIG. 1 and shows an example where the image correction circuit is integrated in an imaging sensor of a camera.

The image correction circuit 50 may be placed either inside the electric device 10 or outside the electric device 10. When the image correction circuit 50 is inside the electric device 10, the image correction circuit 50 may be incorporated in the wiring layer 24 as shown in FIG. 3, or the image correction circuit 50 may be integrated in the imaging sensor 34 as shown in FIG. 4. When the image correction circuit 50 is incorporated in the wiring layer 24 as shown in FIG. 3, an image processing unit to process the image captured by the camera 30 may execute the image correction process or a main CPU (Central Processing Unit) to process various programs may execute the image correction process. That is, the image correction circuit 50 can be realized by various circuits such as the main processing unit, the main CPU and so on.

When the image correction circuit 50 is outside the electric device 10, a computer connected to the electric device 10 may execute the image correction process. In this case, the computer connected to the electric device 10 constitutes the image correction circuit 50.

During the image correction process, in order to improve the sharpness of the image generated by the camera 30, a sharpening process is executed by using PSF (Point Spread Function) which is also called as an inverse filtering process. In more detail, the image correction circuit 50 may execute an image sharpening process based on the optical characteristics of the optical element 40 which can be represented by PSF. The blur of the image captured by the camera 30 can be improved by the image sharpening process. For example, the image sharpening process emphasizes edges of the image by using the inverse filter which is made from the PSF based on the optical characteristics of the optical element 40. In addition, during the image correction process, in order to improve the brightness of the image generated by the camera 30, a global contrast adjustment is also executed.

In the embodiments of the present disclosure, the image correction circuit 50 is not always necessary. That is, the image correction circuit 50 may be omitted in the embodiments of the present disclosure. For example, if the degradation of the image generated by the imaging sensor 34 is not so strong and the quality of the image is good enough for users, the image correction circuit 50 can be omitted. A basic structure of the electric device 10 according to the embodiments of the present disclosure has been explained, and next, several embodiments of the optical element 40 for the electric device 10 will be explained hereinafter.

First Embodiment

In a first embodiment, the optical element 40 of the electric device 10 is configured to include an optical mask which has a transparent region, a gradation region and a mask region and a masking pattern of which corresponds to a wiring pattern of the wires of the wiring layer 24. More detailed will be described below.

Figure 5:
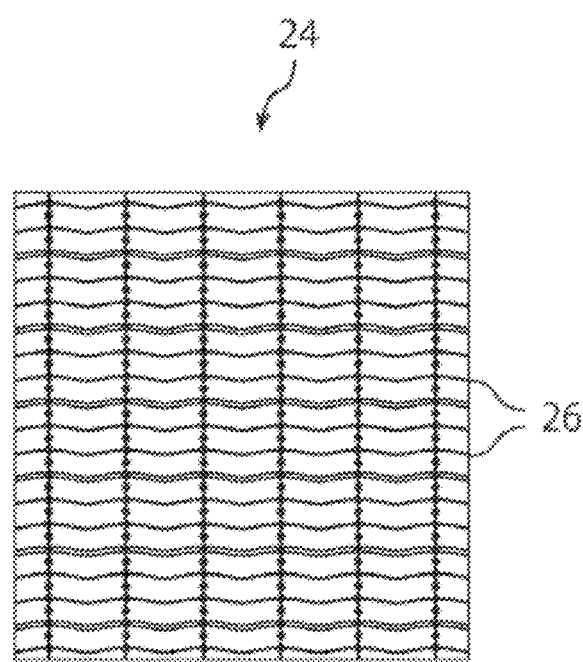
FIG. 5 shows an example of a wiring pattern of the wiring layer of the display.
Figure 6:
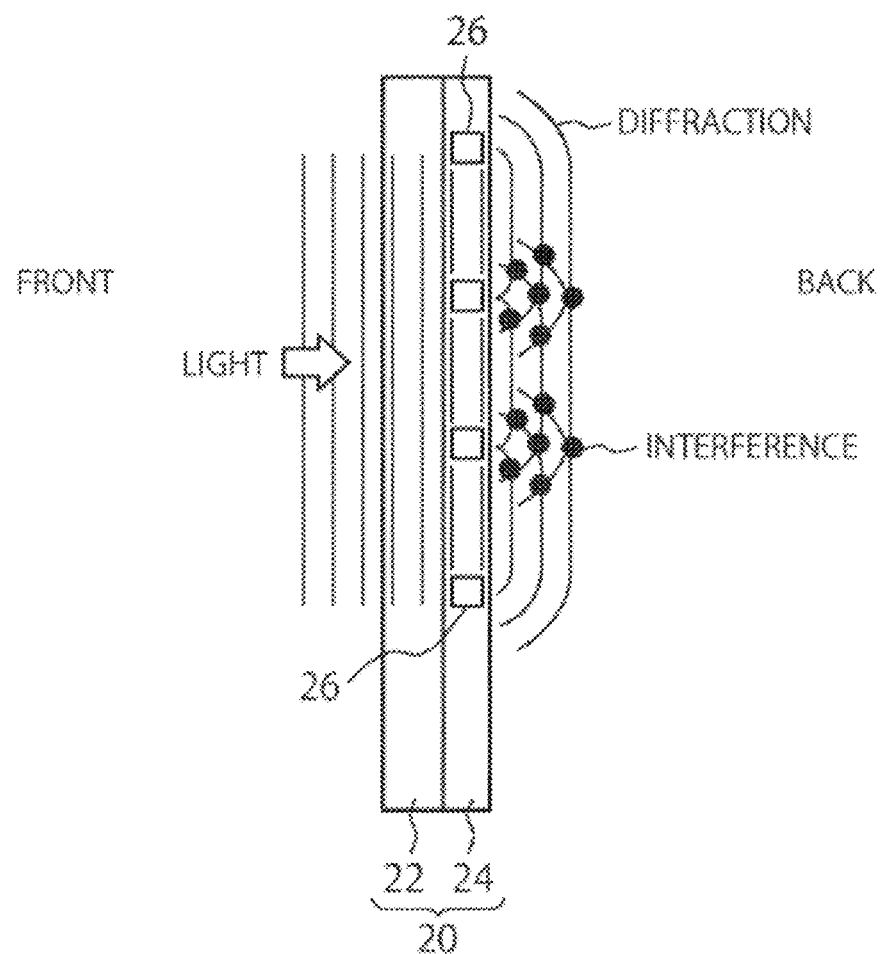
FIG. 6 shows a partial sectional view of the display to explain a phenomenon of a light diffraction.

FIG. 5 illustrates an example of the wiring pattern of the wiring layer 24, and FIG. 6 illustrates a partial sectional view of the display 20 to explain a phenomenon of the diffraction when the light passes through the wiring layer 24.

As shown in FIGS. 5 and 6, the light emitting layer 22 and the wiring layer 24 are substantially transparent but the wiring layer 24 has the wires 26 in the latticed pattern. The function of the wires 26 is to provide an electric power to electrical elements in the light emitting layer 22. Although the wires 26 are also substantially transparent, the wires 26 are obstacles for the light passing through the wiring layer 24 when the camera 30 captures the image through the display 20.

Naturally, the light passing through the display 20 is influenced by the optical characteristics of the display 20, particularly, the obstacles of the wires 26. That is, the light has a property of the waves and the waves have an interference with each other after they pass the wiring layer 24 including the wires 26. The interference causes the diffraction artifact on the image created by the camera 30. That is, if a user takes a picture by the camera 30 behind the display 20, the quality of the image will unfortunately degraded due to the optical disturbance caused by the display 20.

Under the normal conditions, the disturbance is mainly diffraction at the obstacles of the wires 26 in the wiring layer 24. The diffraction causes severe ugly artifact on the image generated by the camera 30. Therefore, if the diffraction of the light can be reduced before the camera 30 senses the light, it would be technically advantageous to improve the quality of the image captured by the camera 30.

Therefore, the electric device 10 according to the first embodiment includes the optical element 40 to filters the light through the display 20 and passes the filtered light to the camera 30. The optical element 40 reduces the diffraction of the light due to the wires 26 of the wiring layer 24.

Figure 7:
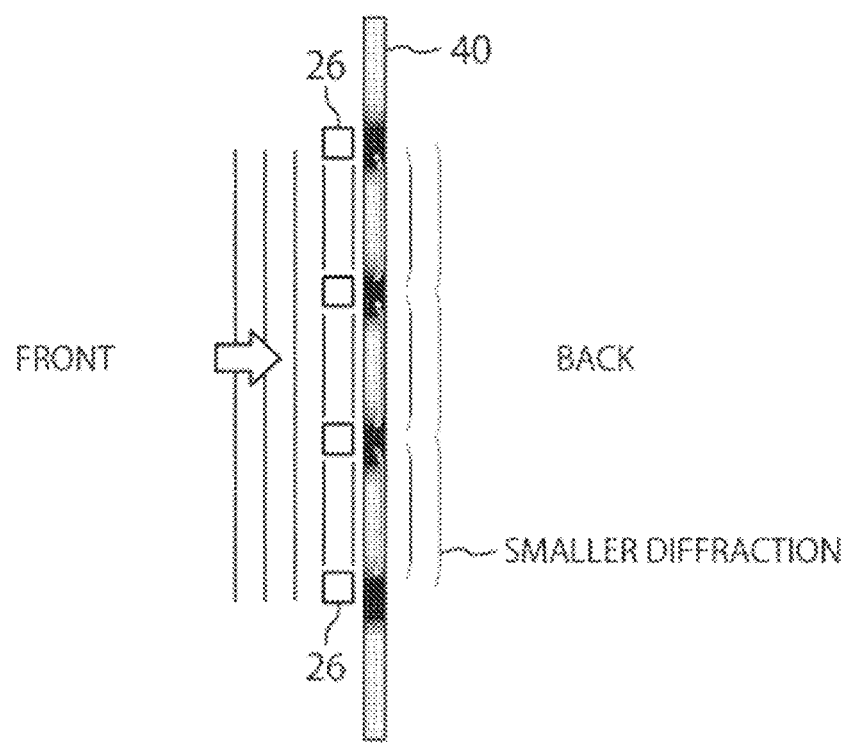
FIG. 7 shows a partial sectional view of wires of the wiring layer the display and an optical element according to a first embodiment to explain a reduction of the light diffraction.
Figure 8:
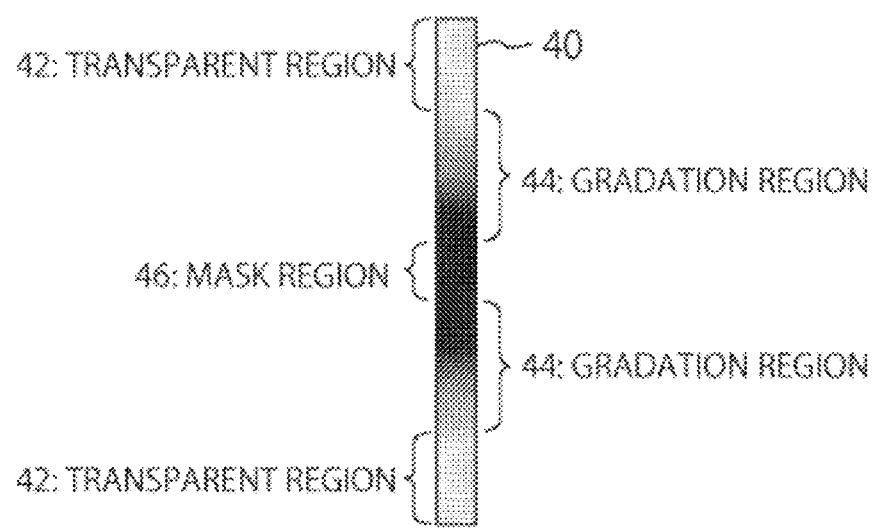
FIG. 8 shows an enlarged partial sectional view of the optical element according to the first embodiment.
Figure 9:
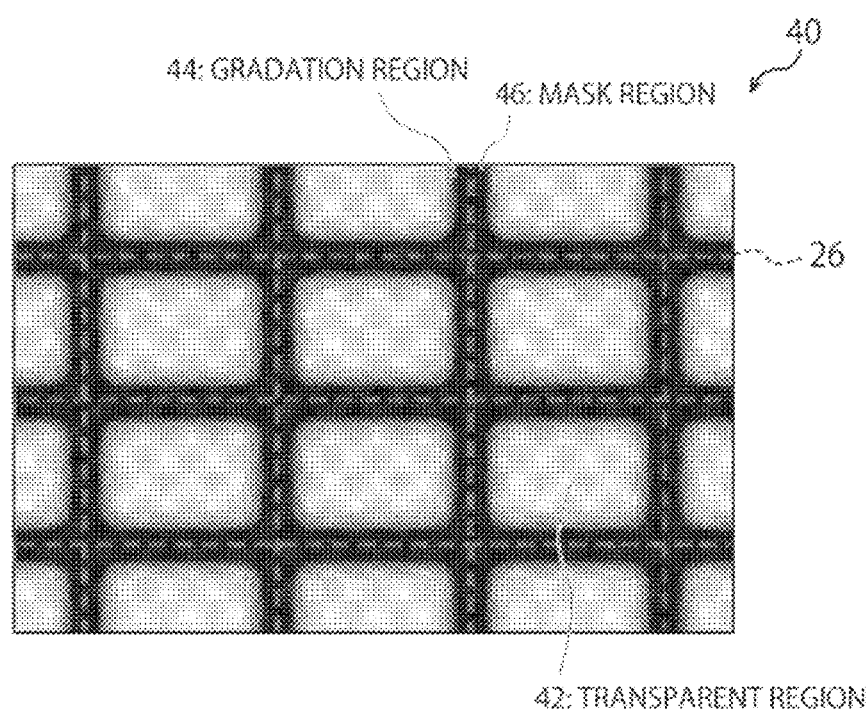
FIG. 9 shows an enlarged partial plan view of the optical element and the wires of the wiring layer of the display.

FIG. 7 illustrates a partial sectional view of the wires 26 and the optical element 40 according to the first embodiment, FIG. 8 illustrates an enlarged sectional view of the optical element 40, and FIG. 9 illustrates an enlarged partial plan view of the optical element 40. Moreover, FIG. 10 shows a graph of a transmittance of the light of the optical element 40 according to the first embodiment.

As shown in FIG. 7 through FIG. 10, the masking pattern of the optical element 40 corresponds to the wiring pattern of the wires 26 of the wiring layer 24. More specifically, the optical element 40 may be an optical mask including a transparent region 42, a gradation region 44 and a mask region 46. The transparent region 42 passes the light from the display 20 to the camera 30. The mask region 46 shields the light from the display 20, and thus the mask region 46 does not pass the light from the display 20 to the camera 30. The gradation region 44 partially passes the light from the display 20 to the camera 30. In addition, the transmittance of the light in the gradation region 44 is gradually changed from the transparent region 42 to the mask region 46.

Figure 10:
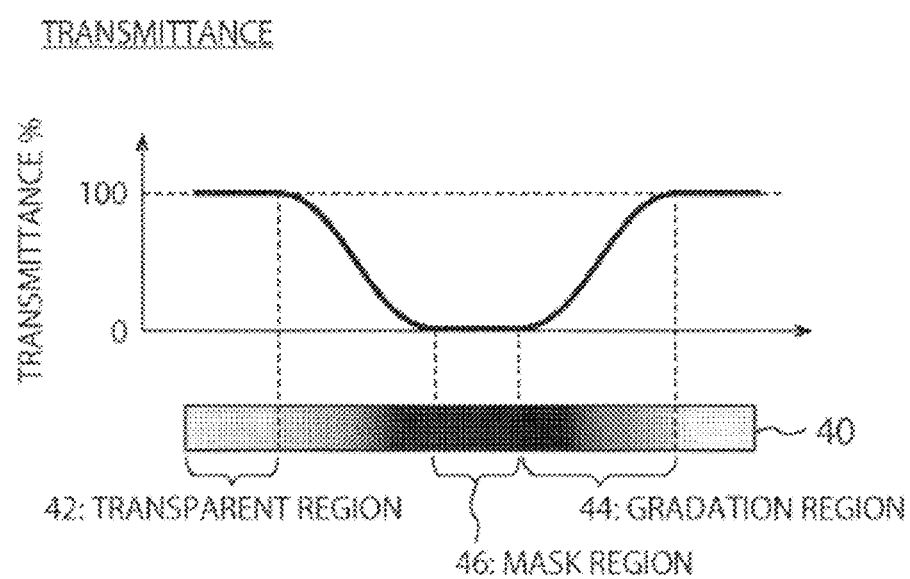
FIG. 10 shows a graph of a transmittance of a light of the optical element shown in FIG. 8.

Particularly, as shown in FIG. 10, in the gradation region 44, the transmittance of a part adjacent to the mask region 46 is substantially zero, i.e., the transmittance thereof is equal to the transmittance of the mask region. The transmittance of the light of the gradation region 44 is gradually increased as approaching the transparent region 42 from the mask region 46. Then, in the gradation region 44, the transmittance of a part adjacent to the transparent region 42 is substantially 100%, i.e., the transmittance thereof is equal to the transmittance of the transparent region. FIG. 10 just shows ideal characteristics of the optical element 40, and therefore real characteristics of the optical element 40 may be different from the graph of FIG. 10.

Moreover, as shown in FIG. 9, the masking pattern of the mask region 46 of the first embodiment corresponds to the wiring pattern of the wires 26 in the wiring layer 24. In other words, the masking pattern of the mask region 46 of the optical element 40 coincides with the wiring pattern of the wires 26 of the wiring layer 24. Therefore, the masking pattern of the mask region 46 is the latticed pattern in the same manner as the wiring pattern of the wires 26. That is, in the first embodiment, the optical element 40 is aligned to cover the wires 26 with the mask region 46.

As shown in FIG. 7, the diffraction is reduced due to the optical element 40. That is, when the light passes between wires 26, the interference of the waves of the light is decreased and thus smaller diffraction can be expected.

Figure 11:
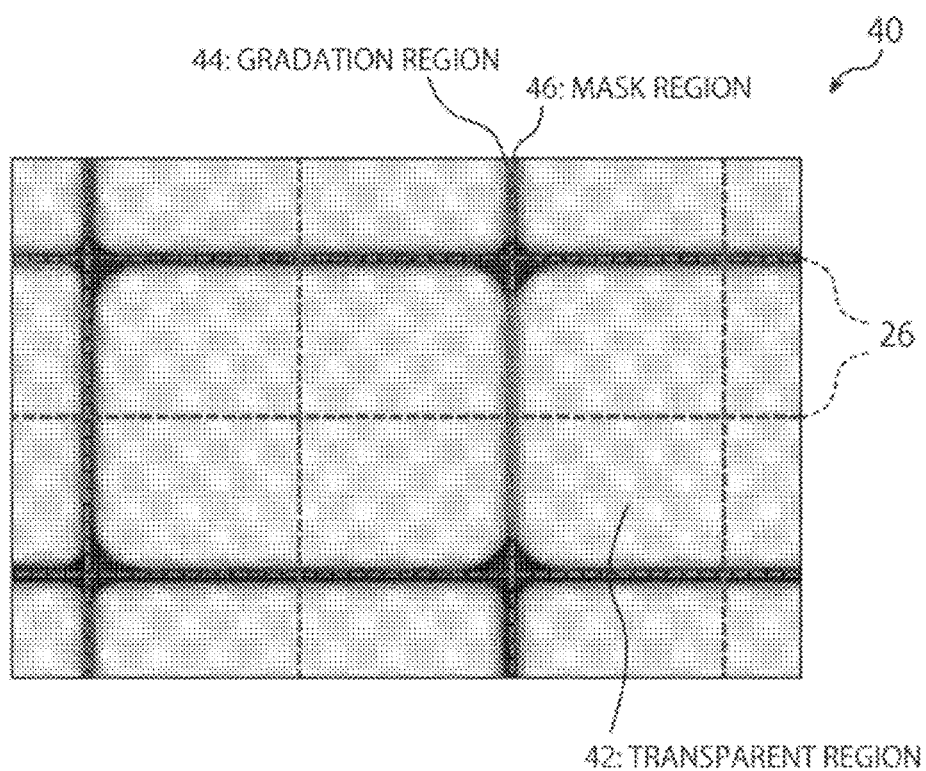
FIG. 11 shows an enlarged partial plan view of another example of the optical element.

The masking pattern of the optical element 40 is not limited to that of FIG. 9, but various masking patterns of the optical element 40 can be employed. For example, as shown in FIG. 11 which corresponds to the plan view of the optical element 40 of FIG. 9, a part of the mask region 46 can be omitted. In an example of FIG. 11, the mask region 46 is provided for every other line of the wires 26 in the wiring layer 24. The optical element 40 of FIG. 11 can also attenuate the diffraction in the same manner as the optical element 40 of FIG. 9. Although an attenuation effect on the diffraction of the optical element 40 of FIG. 11 would be smaller than that of FIG. 9, a degradation of the image due to the optical element 40 of FIG. 11 would be smaller than that of FIG. 9.

Generally, the mask region 46 of the masking pattern may be provided for a plurality of the wires 26 of the wiring pattern of the wiring layer 24. That is, one line of the mask region 46 of the masking pattern can be provided for every three, four and more wires 26 of the wiring pattern of the wiring layer 24.

Figure 12:
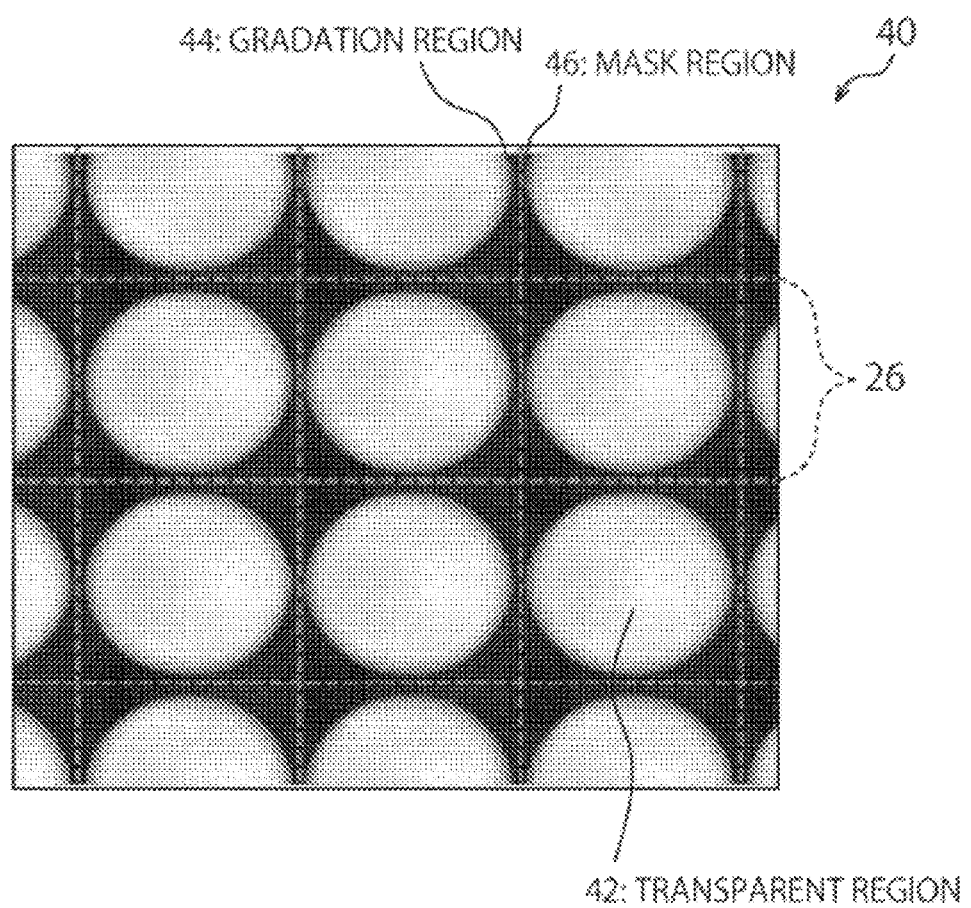
FIG. 12 shows an enlarged partial plan view of still another example of the optical element.

For another example, as shown in FIG. 12 which corresponds to the plan view of the optical element 40 of FIG. 9, the mask region 46 can be enlarged in areas behind around the intersections of the wires 26. In other words, the transparent region 42 is a circular form and the region between the circular transparent regions 42 is the mask region 46.

It is considered that the intersections of the wires 26 causes more significant diffraction than the other part of the wires 26 does. Therefore, the optical element 40 of FIG. 12 can reduce the diffraction more than the optical element 40 of FIG. 9 does.

Figure 13:
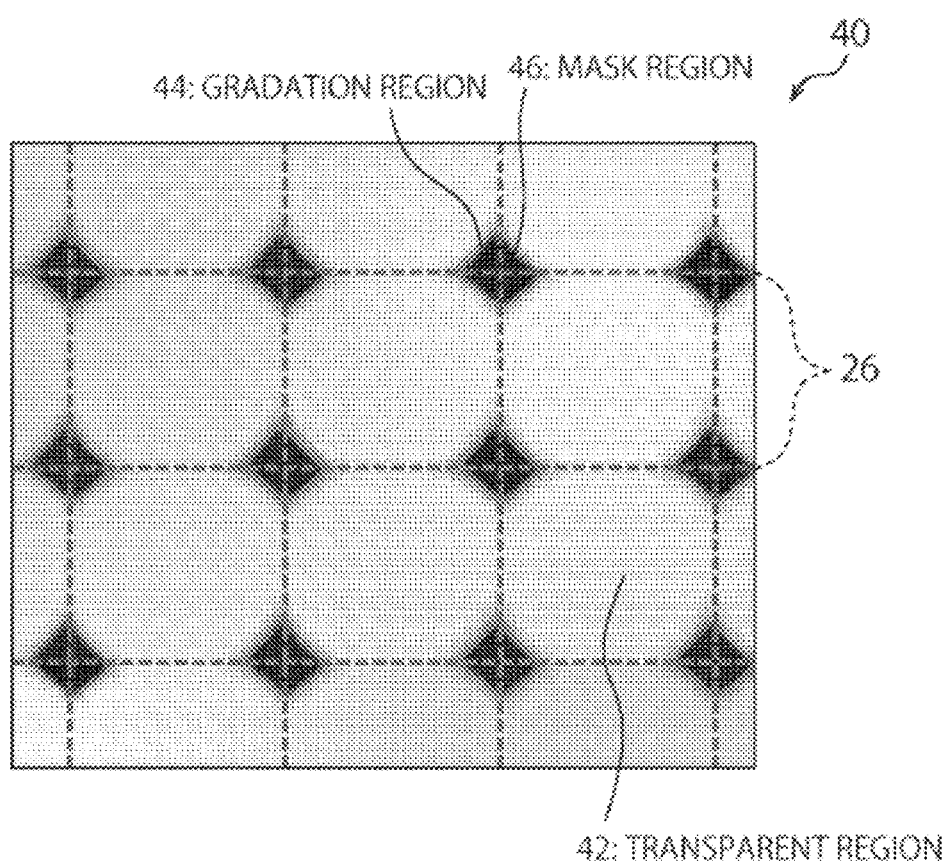
FIG. 13 shows an enlarged partial plan view of still further another example of the optical element.

For still another example, as shown in FIG. 13 which corresponds to the plan view of the optical element 40 of FIG. 12, the mask region 46 of the optical element 40 can be formed in areas behind around the intersections of the wires 26 but the mask region 46 of the optical element 40 is not formed in the other areas. That is, the mask region 46 of the optical element 40 is not formed in areas behind the other part of the wires 26 than the intersections.

Although the reduction of the diffraction caused by the optical element 40 of FIG. 13 would be smaller than that caused by the optical element 40 of FIG. 12, the sharpness of the image filtered by the optical element 40 of FIG. 13 would be better than that filtered by the optical element 40 of FIG. 12. Since the intersections of the wires 26 generate the considerable diffraction, the optical element 40 can reduce the diffraction as well as suppress a side effect of the degradation of the sharpness on the image.

As understood from description of the optical element 40 mentioned above, the masking pattern of the mask region 46 corresponding to the wiring pattern of the wires 26 does not mean that the masking pattern of the mask region 46 is completely congruent with the wiring pattern of the wires 26. In the present disclosure, the masking pattern of the mask region 46 corresponding to the wiring pattern of the wires 26 means that the masking pattern of the mask region 46 is associated with the wiring pattern of the wires 26 so as to attenuate the diffraction.

Figure 14:
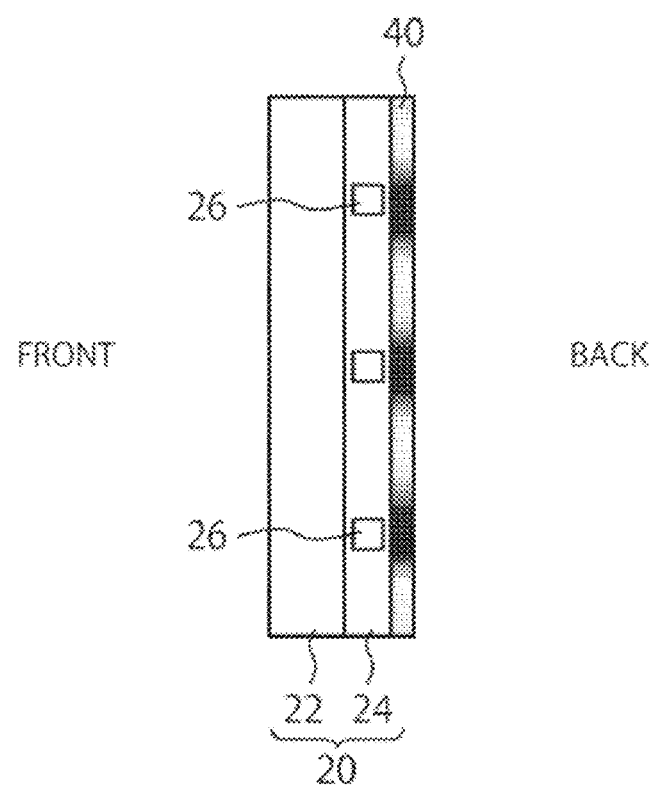
FIG. 14 shows an example where the optical element is attached to the display.

Furthermore, in the embodiments of the present disclosure, although the optical element 40 is located between the display 20 and the camera 30, the position of the optical element 40 is optional choice between the display 20 and the camera 30. For example, as shown in FIG. 14, the optical element 40 may be attached to the display 20. In FIG. 14, the optical element 40 is attached to and behind the wiring layer 24 of the display 20. In this case, the optical element 40 can be placed as close to the wires 26 as possible. In addition, the display 20 and the optical element 40 are produced separately and the optical element 40 can be attached to the display 20 later.

Figure 15:
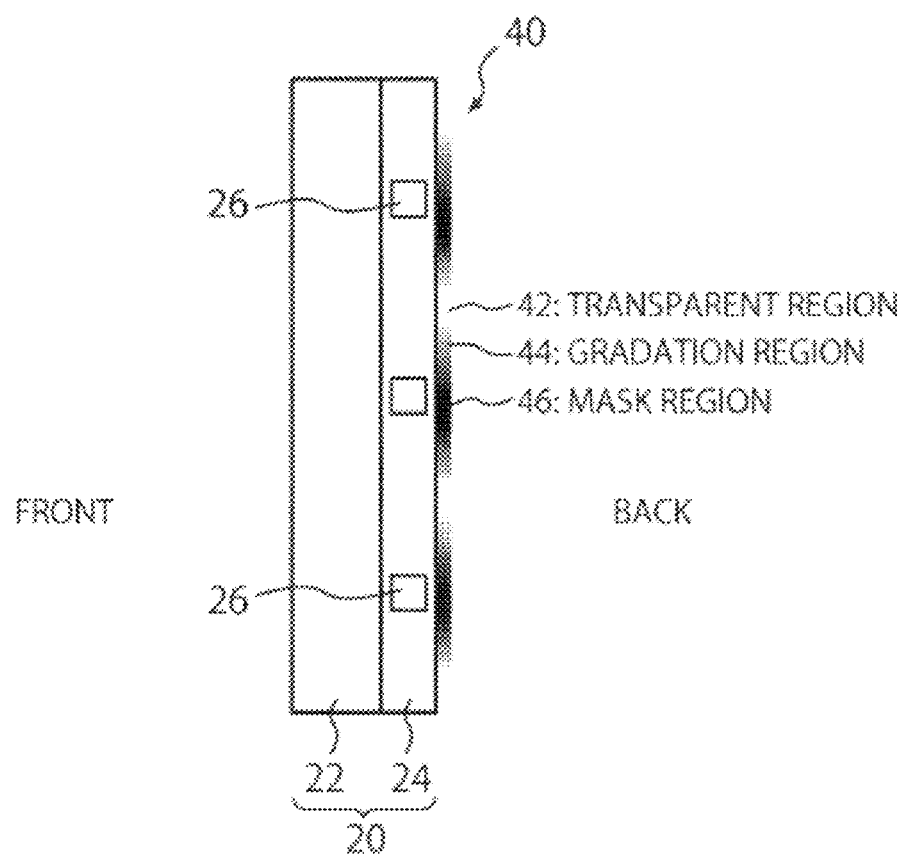
FIG. 15 shows an example where the optical element is printed on a back surface of the display.

On the other hand, as shown in FIG. 15, the optical element 40 may be incorporated in the display 20. For example, the optical element 40 may be produced by printing the masking pattern on a back surface of the wiring layer 24 of the display 20. That is, the mask region 46 and the gradation region 44 of the masking pattern of the optical element 40 may be made of printing ink. For example, the mask region 46 may be printed by deep black ink. The gradation region 44 is printed by a combination light black ink and transparent ink such that the transmittance of the light is gradually increased as approaching the transparent region 42 from the mask region 46. Otherwise, the mask region 46 and the gradation region 44 may be made of materials to absorb the light through the display 20 instead of the black ink.

In addition, the transparent region 42 may be made of space between the gradation region 44. That is, nothing is printed on the back surface of the wiring layer 24 in the transparent region 42.

In the optical element 40 of FIG. 15, a manufacturer needs to produce the display 20 on which the optical element 40 is incorporated but assembling process to interpose the optical element 40 between the display 20 and the camera 30 can be omitted. In addition, the transparent region 42 can perfectly pass the light from the display 20 to the camera 30 if the transparent region 42 is made of space, i.e. air. However, the transparent region 42 may be made of any transparent material. For example, the transparent region 42 may be made by printing the transparent ink on the back surface of the wiring layer 24. Otherwise, the same material as that of the transparent region 42 of the optical element 40 in FIG. 14 may be used to create the transparent region 42 in FIG. 15.

As mentioned above, since the optical mask of the optical element 40 is interposed between the display 20 and the camera 30, the diffraction due to the wires 26 of the wiring layer 24 can be decreased. Therefore, it is possible to reduce the diffraction artifact generated on the image obtained by the camera 30.

Incidentally, the number of layers of the optical element 40 is not limited to one. Namely, the optical element 40 may include superimposed a plurality of optical masks, each of which has the transparent region 42, the gradation region 44 and the mask region 46.

Second Embodiment

In an electric device 10 according to a second embodiment, the optical element 40 includes a diffuser to reduce the diffraction instead of the optical mask whose masking pattern corresponds to that of the wires 26. Hereinafter, an explanation will be made for differentials from the first embodiment.

Figure 16:
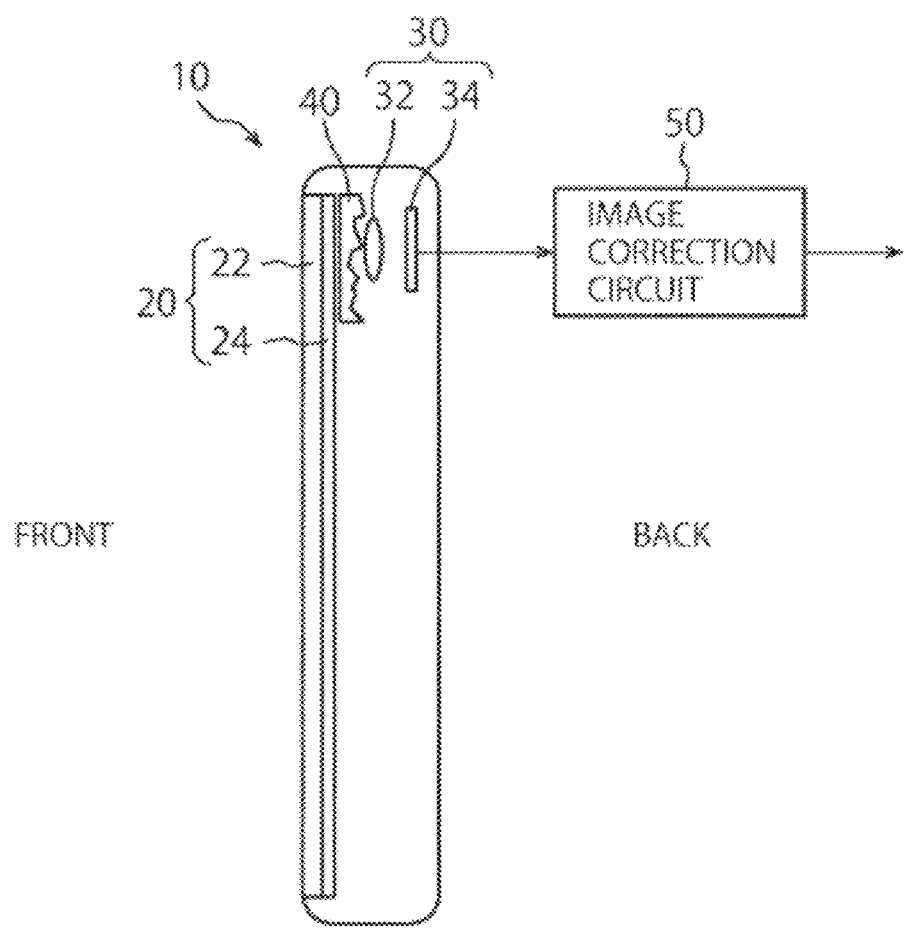
FIG. 16 shows a cross sectional view of the electric device according to a second embodiment.

FIG. 16 illustrates a cross sectional view taken along line II-II of the electric device 10 of FIG. 1 and corresponds to FIG. 2 of the first embodiment. As shown in FIG. 16, the camera 30 includes the optical element 40 which includes a diffuser to attenuate the diffraction. That is, the diffuser of the optical element 40 is located between the display 20 and camera 30. As mentioned in the first embodiment, the image correction circuit 50 may be placed either inside the electric device 10 or outside the electric device 10. The other structure of the electric device 10 than the optical element 40 is substantially the same as that of the first embodiment mentioned above.

Figure 17:
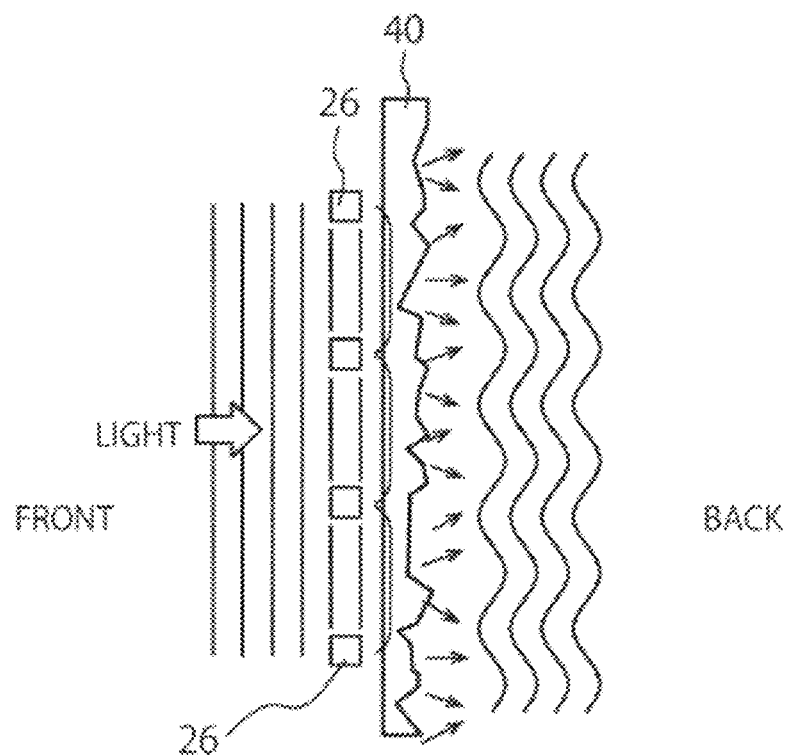
FIG. 17 shows a partial sectional view of the wires and an optical element according to the second embodiment to explain a reduction of the light diffraction.

FIG. 17 illustrates a partial sectional view of the wires 26 and the optical element 40 according to the second embodiment and corresponds to FIG. 7 of the first embodiment.

As shown in FIG. 17, the optical element 40 is configured to diffuse the light from the display 20 to the camera 30. In the present embodiment, the optical element 40 is constructed by a frosted glass filter to scatter the wave of the light through the display 20. As a result, the diffraction of the light can be prevented.

On the other hand, in accordance with the optical element 40 shown in FIG. 17, the image created by the camera 30 would be blurry due to the diffusion of the optical element 40. That is, the diffuser of the optical element 40 degrades the sharpness of the image. It is a side effect of the diffuser of the optical element 40. Therefore, the image correction circuit 50 needs to compensate the blurry image by the image correction process.

More specifically, the image correction circuit 50 executes the sharpening process by using the PSF, which is an inversing filtering process. In addition, the image correction circuit 50 also executes the global contrast adjustment for the image. In other words, a combination of the diffuser of the optical element 40 and the compensation process of the image correction circuit 50 is necessary to create a clear image in the second embodiment.

However, if the diffusion of the optical element 40 is not significant, the compensation process by the image correction circuit 50 can be omitted.

As mentioned above, since the optical element 40 includes the diffuser, the optical element 40 can prevent the diffraction due to the wires 26 of the wiring layer 24. Therefore, it is possible to reduce the diffraction artifact generated on the image obtained by the camera 30.

Incidentally, the number of layers of the optical element 40 is not limited to one. Namely, the optical element 40 may include superimposed a plurality of diffusion layers, each of which diffuses the light through the display 20.

Figure 18:
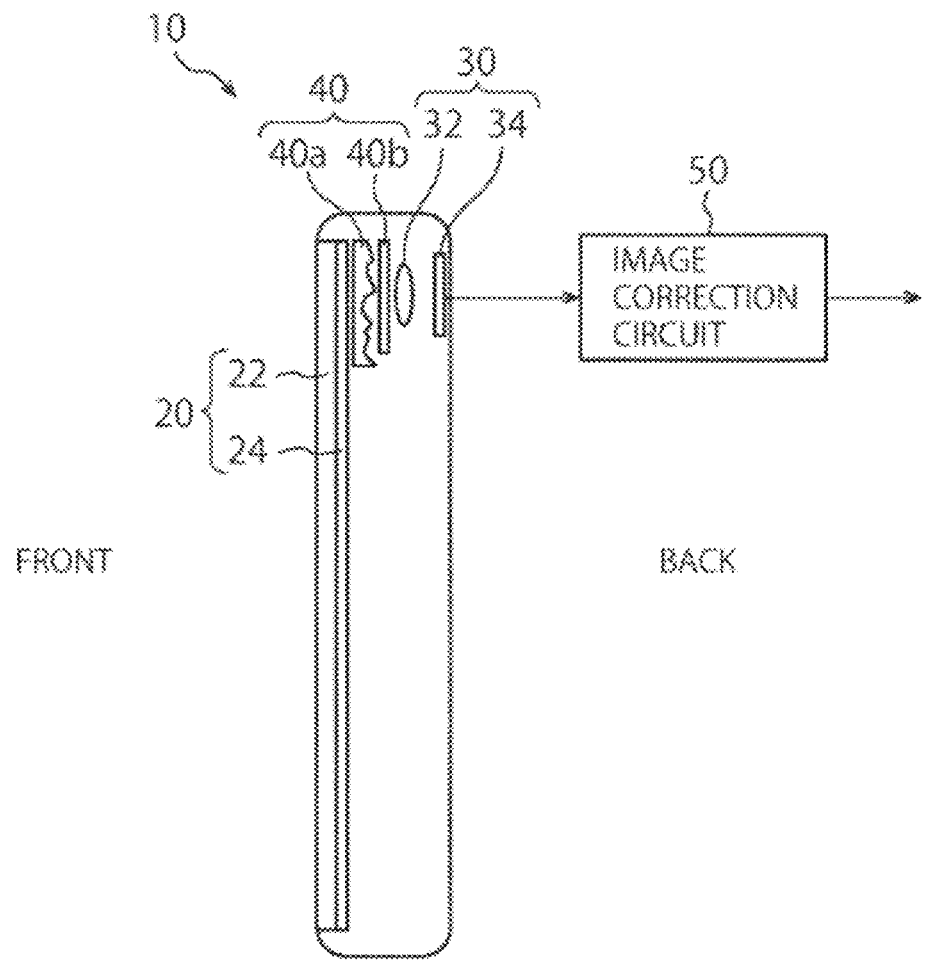
FIG. 18 shows a cross sectional view of the electric device according to a combination of the first and second embodiments.

In addition, the imaging device of the second embodiment can be combined with the imaging device of the first embodiment. In the combination of the first embodiment and the second embodiment, as shown in FIG. 18, the optical element 40 may include a diffuser 40a according to the second embodiment and an optical mask 40b according to the first embodiment. The diffuser 40a is located at a front side of the display 20 and the optical mask 40b is located at the back side of the display 20.

Figure 19:
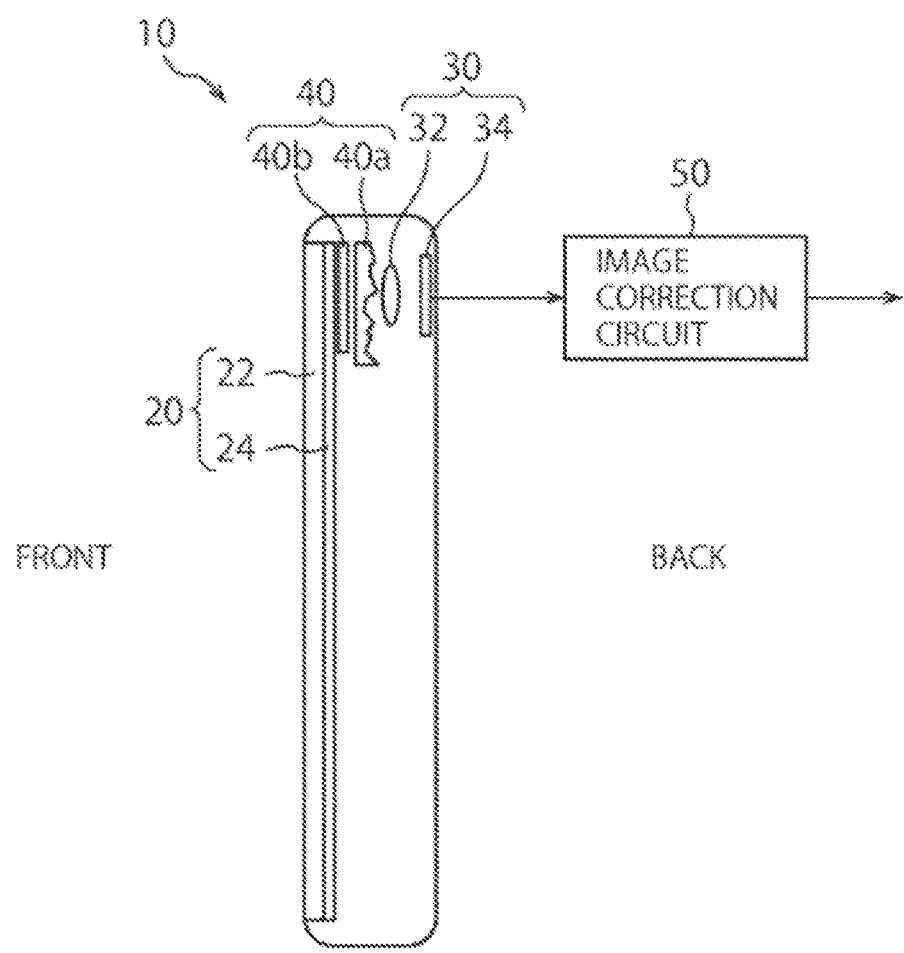
FIG. 19 shows a cross sectional view of the electric device according to another combination of the first and second embodiments.

In contrast with the electric device 10 of FIG. 18, as shown in FIG. 19, the optical mask 40b according to the first embodiment may be located at the front side of the display 20 and the diffuser 40a according to the second embodiment may be located at the back side of the display 20.

Third Embodiment

In an electric device 10 according to a third embodiment, the optical element 40 is incorporated in the wiring layer 24 of the display 20. Hereinafter, an explanation will be made for differentials from the first embodiment.

Figure 20:
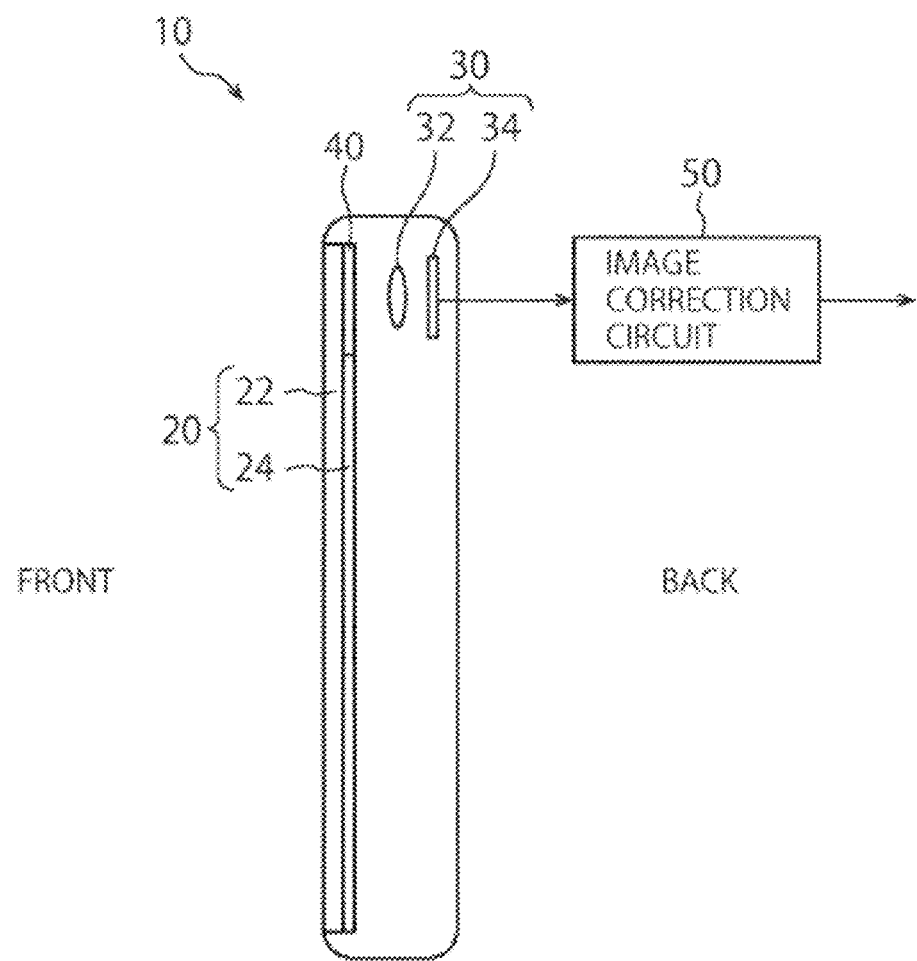
FIG. 20 shows a cross sectional view of the electric device according to a third embodiment.

FIG. 20 illustrates a cross sectional view taken along line II-II of the electric device 10 of FIG. 1 and corresponds to FIG. 2 of the first embodiment. As shown in FIG. 20, the optical element 40 to reduce the diffraction is incorporated in the wiring layer 24 of the display 20.

Figure 21:
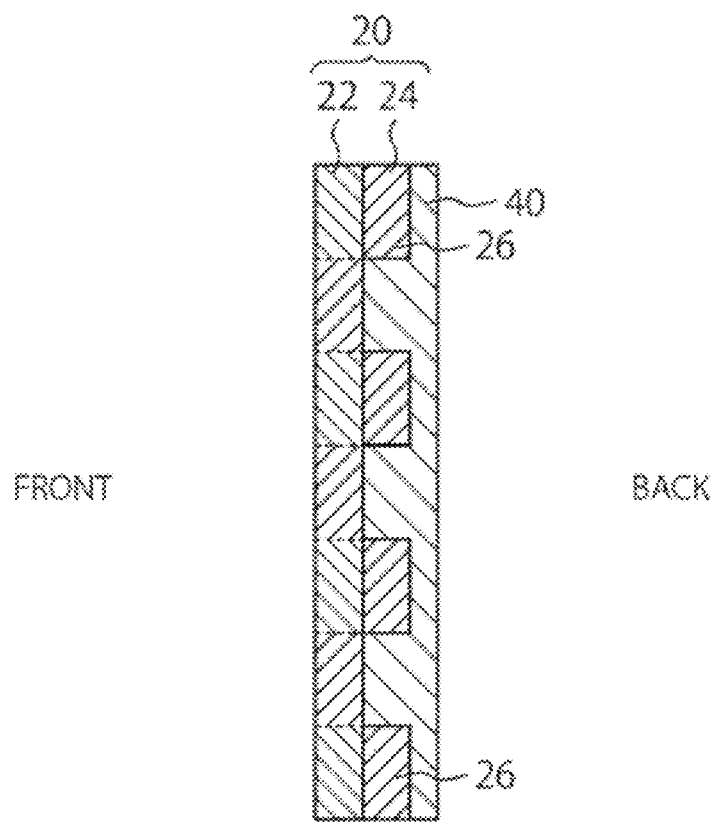
FIG. 21 shows an enlarged partial sectional view of the display and an optical element according to the third embodiment.

FIG. 21 illustrates a partial sectional view of the display 20 and the optical element 40 according to the third embodiment. As shown in FIG. 21, the display 20 is made of the OLED and the light emitting layer 22 and the wiring layer 24 are substantially transparent, but a back surface of the wiring layer 24 is uneven. That is, the wires 26 are convex toward a travel direction of the light through the display 20. The uneven back surface of the wiring layer 24 causes the diffraction of the light. Here, the back surface of the wiring layer 24 is a back side of the wiring layer 24 of the display 20.

Therefore, in electric device 10 of the third embodiment, the optical element 40 is interposed between the display 20 and the camera 30 but the optical element 40 is incorporated in the display 20. Also here, it can be explained that the optical element 40 is placed between the display 20 and the camera 30.

The optical element 40 covers the uneven back surface of the wiring layer 24 of the display 20. In other words, the concave parts of the wiring layer 24 are filled with the optical element 40. The optical element 40 is made of the transparent material to pass and filter the light from the display 20 to the camera 30.

The material of the optical element 40 may be filled to the concave parts of the wiring layer 24 but the material in the concave parts of the wiring layer 24 can be connected with each other as shown in FIG. 21. In other words, the back surface of the wiring layer 24 is covered with the material of the optical element 40.

Figure 22:
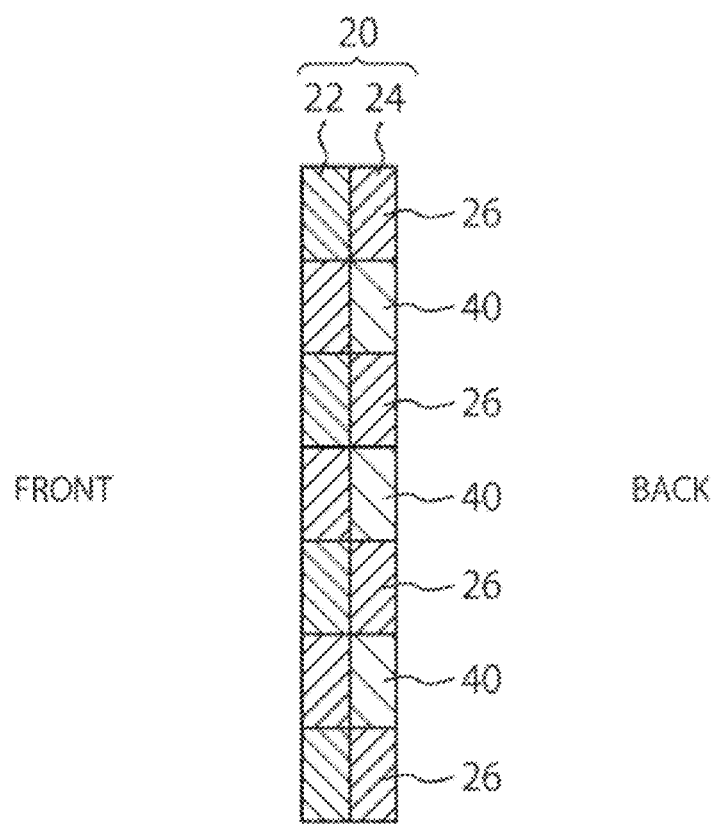
FIG. 22 shows an enlarged partial sectional view of the display and a modified optical element according to the third embodiment.

In contrast with FIG. 21, the materials in the concave parts may not be connected with each other as shown in FIG. 22. That is, it is enough to flatten the back surface of the wiring layer 24 by filling the material of the optical element 40 to the concave parts of the wiring layer 24 to reduce the diffraction due to the uneven back surface of the wiring layer 24.

As mentioned above, since the optical element 40 flattens the back surface of the display 20, the optical element 40 can prevent the diffraction due to the uneven back surface formed by the wires 26. Therefore, it is possible to reduce the diffraction artifact generated on the image obtained by the camera 30.

Modification of First, Second and Third Embodiments

Figure 23:
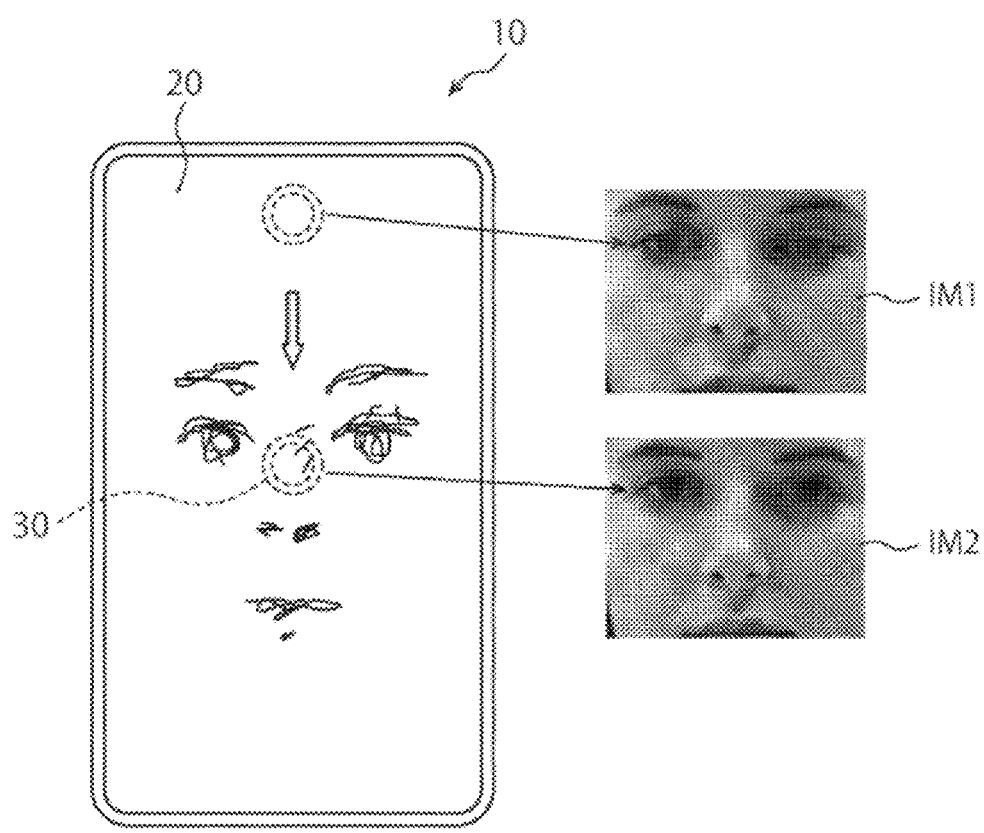
FIG. 23 shows a schematic plan view of an electric device according to a modification of the first through third embodiments.

Since the display 20 is composed of the transparent display, the camera 30 can be placed in the electric device 10 anywhere. For example, as shown in FIG. 23 which illustrates a plan view of the electric device 10 according to a modification of the first, second and third embodiments and which corresponds to FIG. 1, the camera 30 may be placed in a middle area of the electric device 10. Especially, in the present modification, the camera 30 is placed at the center of the electric device 10.

In accordance with the electric device 10 according to the first through third embodiments, the camera 30 can be mounted behind the display 20 without ugly artifacts caused by the diffraction. This enables to set the camera 30 anywhere behind the display 20, and this makes it possible to take natural eye point selfie without any costly computation.

More specifically, if the camera 30 is mounted in an upper area of the electric device 10 as shown in FIG. 1, the eye point of the selfie image IM1 is not natural as shown in FIG. 23. On the other hand, if the camera 30 is mounted in the middle area of the electric device 10 as shown in FIG. 23, the eye point of the selfie image IM2 can be natural. Here, the middle area does not necessarily mean that the camera 30 is mounted at the center of the electric device 10. That is, the camera 30 may be placed at around the center of the electric device 10 in order to obtain the selfie image IM2 with natural eye point. In other words, the middle area means an area including the center of the electric device 10 and a peripheral area of the center of the electric device 10. A distance between eye positions of a displayed face and the camera 30 in a case where the camera 30 is placed in the middle area is smaller than that in a case where the camera 30 is placed in the upper area of the electric device 10. Therefore, the user of the electric device 10 can easily take a selfie image with natural eye point.

Moreover, the electric device 10 of FIG. 23 is a type of a full covered display smartphone. There is no area to allocate the camera 30 on the front surface of the display 20, and thus a wider area for the display 20 can be realized on the front surface of the electric device 10.

In the description of embodiments of the present disclosure, it is to be understood that terms such as "central", "longitudinal", "transverse", "length", "width", "thickness", "upper", "lower", "front", "rear", "left", "right", "vertical", "horizontal", "top", "bottom", "inner", "outer", "clockwise" and "counterclockwise" should be construed to refer to the orientation or the position as described or as shown in the drawings under discussion. These relative terms are only used to simplify description of the present disclosure, and do not indicate or imply that the device or element referred to must have a particular orientation, or constructed or operated in a particular orientation. Thus, these terms cannot be constructed to limit the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present disclosure, "a plurality of" means two or more than two, unless specified otherwise.

In the description of embodiments of the present disclosure, unless specified or limited otherwise, the terms "mounted", "connected", "coupled" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the embodiments of the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

Various embodiments and examples are provided in the above description to implement different structures of the present disclosure. In order to simplify the present disclosure, certain elements and settings are described in the above. However, these elements and settings are only by way of example and are not intended to limit the present disclosure. In addition, reference numbers and/or reference letters may be repeated in different examples in the present disclosure. This repetition is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Reference throughout this specification to "an embodiment", "some embodiments", "an exemplary embodiment", "an example", "a specific example" or "some examples" means that a particular feature, structure, material, or characteristic described in connection with the embodiment or example is included in at least one embodiment or example of the present disclosure. Thus, the appearances of the above phrases throughout this specification are not necessarily referring to the same embodiment or example of the present disclosure. Furthermore, the particular features, structures, materials, or characteristics may be combined in any suitable manner in one or more embodiments or examples.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, in which it should be understood by those skilled in the art that functions may be implemented in a sequence other than the sequences shown or discussed, including in a substantially identical sequence or in an opposite sequence.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks, CD, etc.

Although embodiments of the present disclosure have been shown and described, it would be appreciated by those skilled in the art that the embodiments are explanatory and cannot be construed to limit the present disclosure, and changes, modifications, alternatives and variations can be made in the embodiments without departing from the scope of the present disclosure.

What is claimed is:

1. An imaging device, comprising:
   a display including a wiring layer;
   a camera located at a back side of the display, the camera including an optical lens and an imaging sensor to sense the light through the display to create an image; and
   an optical element between the display and the camera, wherein the optical element filters the light through the display and passes the filtered light to the camera, and the optical element reduces a diffraction due to the wiring layer,
   wherein the optical element includes an optical mask that has a mask region to shield the light from the display to the camera, wherein a masking pattern of the mask region corresponds to a wiring pattern of wires of the wiring layer, and wherein the mask region of the masking pattern satisfies at least one of:
   the mask region of the masking pattern being provided for every other line of the wires of the wiring pattern;
   the mask region of the masking pattern being provided for a plurality of the wires of the wiring pattern of the wiring layer;

the mask region being enlarged in areas behind around intersections of the wires; or the mask region being formed in areas behind around the intersections of the wires and the mask region being not formed in the other areas.

2. The imaging device according to claim 1, wherein the optical mask further includes a transparent region which passes the light from the display to the camera, and a gradation region which partially passes the light from the display to the camera, wherein a transmittance of the light in the gradation region is gradually increased as approaching the transparent region from the mask region.

3. The imaging device according to claim 1, wherein the masking pattern of the mask region coincides with the wiring pattern of the wires.

4. The imaging device according to claim 1, wherein the optical element is attached to the display.

5. The imaging device according to claim 1, wherein the optical element is incorporated in the display.

6. The imaging device according to claim 1, wherein the optical element includes a diffuser to diffuse the light from the display to the camera.

7. The imaging device according to claim 1, wherein the optical element flattens a back surface of the wiring layer of the display.

8. The imaging device according to claim 7, wherein the optical element is filled to concave parts of the wiring layer.

9. The imaging device according to claim 1, wherein the camera is placed in a middle area of the display.

10. An electric device, comprising:
    an imaging device, comprising:
        a display including a wiring layer;
        a camera located at a back side of the display, the camera including an optical lens and an imaging sensor to sense the light through the display to create an image;
        an optical element between the display and the camera, wherein the optical element filters the light through the display and passes the filtered light to the camera, and the optical element reduces a diffraction due to the wiring layer; and
        an image correction circuitry configured to correct the image created by the camera,
    wherein the optical element includes an optical mask that has a mask region to shield the light from the display to the camera, wherein a masking pattern of the mask region corresponds to a wiring pattern of wires of the wiring layer, and wherein the mask region of the masking pattern satisfies at least one of:
        the mask region of the masking pattern being provided for every other line of the wires of the wiring pattern;
        the mask region of the masking pattern being provided for a plurality of the wires of the wiring pattern of the wiring layer;
        the mask region being enlarged in areas behind around intersections of the wires; or
        the mask region being formed in areas behind around the intersections of the wires and the mask region being not formed in the other areas.

11. The electric device according to claim 10, wherein the image correction circuitry executes an image correction process to improve a sharpness of the image.

12. The electric device according to claim 11, wherein the image correction circuitry is integrated in the imaging sensor.

13. The electric device according to claim 11, wherein the image correction circuitry is incorporated in the wiring layer.

* * * * *